United States Patent
Jeon et al.

(10) Patent No.: US 10,613,270 B2
(45) Date of Patent: Apr. 7, 2020

(54) DISPLAY APPARATUS

(71) Applicant: SAMSUNG ELECTRONICS CO., LTD., Suwon-si (KR)

(72) Inventors: Jong Pil Jeon, Goyang-si (KR); Kye Hoon Lee, Yongin-si (KR); Joon Seok Ahn, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/208,163

(22) Filed: Jul. 12, 2016

(65) Prior Publication Data
US 2017/0082794 A1 Mar. 23, 2017

(30) Foreign Application Priority Data

Sep. 21, 2015 (KR) .................. 10-2015-0133211

(51) Int. Cl.
G02F 1/1345 (2006.01)
F21V 8/00 (2006.01)
(Continued)

(52) U.S. Cl.
CPC ........... *G02B 6/0083* (2013.01); *G02B 6/009* (2013.01); *G02B 6/0031* (2013.01); *G02F 1/1336* (2013.01); *G02F 1/133308* (2013.01); *H01R 12/70* (2013.01); *H05K 1/118* (2013.01); *G02B 6/0068* (2013.01); *G02F 2001/133314* (2013.01); *G02F 2001/133612* (2013.01);
(Continued)

(58) Field of Classification Search
None
See application file for complete search history.

(56) References Cited

U.S. PATENT DOCUMENTS 9,395,577 B2 * 7/2016 Li ..................... G02F 1/133603
2010/0007814 A1 1/2010 Kim
(Continued)

FOREIGN PATENT DOCUMENTS

EP 2 573 616 A2 3/2013
JP 2012-22779 2/2012
(Continued)

OTHER PUBLICATIONS

Extended European Search Report dated Sep. 8, 2016 in corresponding European Patent Application No. 16167806.5.
(Continued)

*Primary Examiner* — Richard H Kim
(74) *Attorney, Agent, or Firm* — Staas & Halsey LLP

(57) ABSTRACT

Disclosed is a display apparatus having a liquid crystal panel to display images; a light source to supply light to the liquid crystal panel; and a printed circuit board having a light source embedding unit in which the light source is embedded, and a connector mounting unit at which a connector configured to connect to an outside circuit is mounted. The printed circuit board is bent such that the connector mounting unit may be positioned lower than or offset from the light source embedding unit. The printed circuit board may be bent such that the connector may not be protruded further upward than the height of an upper surface of the light source embedding unit, and thus the thickness of the display apparatus may be improved.

14 Claims, 14 Drawing Sheets

(51) Int. Cl.
*G02F 1/1333* (2006.01)
*H01R 12/70* (2011.01)
*H05K 1/11* (2006.01)
*G02F 1/13357* (2006.01)
*H01R 12/72* (2011.01)
*H01R 24/60* (2011.01)
*H05K 1/18* (2006.01)
*G02F 1/1335* (2006.01)

(52) U.S. Cl.
CPC ............ *G02F 2001/133628* (2013.01); *H01R 12/722* (2013.01); *H01R 24/60* (2013.01); *H01R 2201/18* (2013.01); *H05K 1/189* (2013.01); *H05K 2201/09063* (2013.01); *H05K 2201/10106* (2013.01); *H05K 2201/10136* (2013.01); *H05K 2201/10189* (2013.01); *H05K 2201/10446* (2013.01)

(56) References Cited

U.S. PATENT DOCUMENTS

| 2011/0007242 A1* | 1/2011 | Lee | G02F 1/133608 349/65 |
|---|---|---|---|
| 2011/0134371 A1 | 6/2011 | Shimojoh et al. | |
| 2011/0164199 A1 | 7/2011 | Han et al. | |
| 2012/0026424 A1 | 2/2012 | Youk et al. | |
| 2013/0077026 A1 | 3/2013 | Seo et al. | |
| 2015/0003108 A1 | 1/2015 | Park et al. | |

FOREIGN PATENT DOCUMENTS

| JP | 2012-89350 | 5/2012 |
|---|---|---|
| KR | 10-0850680 | 8/2008 |
| KR | 10-1337253 | 12/2013 |

OTHER PUBLICATIONS

International Search Report dated Nov. 15, 2016 in corresponding International Patent Application No. PCT/KR2016/008742.

European Communication pursuant to Article 94(3) EPC issued in European Application No. 16 167 806.5 dated Apr. 5, 2018 (6 pages).

European Office Action dated Sep. 18, 2019 in corresponding European Patent Application No. 16167806.5.

* cited by examiner

200

DISPLAY APPARATUS

CROSS-REFERENCE TO RELATED APPLICATION

This application claims the benefit of the Korean Patent Application No. 10-2015-0133211, filed on Sep. 21, 2015, in the Korean Intellectual Property Office, the disclosure of which is incorporated herein by reference.

BACKGROUND

1. Field

Embodiments of the present disclosure relate to a display apparatus having a backlight unit.

2. Description of the Related Art

In general, a display apparatus is a type of an output apparatus configured to visually display data information and images of text characters and geometric figures.

The display apparatus may be classified into a light emitting type display apparatus using a display panel such as an OLED (Organic Light Emitting Diode) configured to self-radiate light, and a light receiving type display apparatus using a display panel such as a LCD (Liquid Crystal Display) configured to be supplied with light from a backlight unit as to radiate light while not provided to self-radiate light.

The backlight unit of the light receiving type display apparatus includes a light source, a light source module provided with a printed circuit board, and various optical members. The various optical members may be accumulated, combined, brought together or assembled on the printed circuit board.

The printed circuit board may be provided with a connector configured to connect the light source to an outside circuit assembled thereto, and the assembly position of the connector may vary according to the structure of the printed circuit board or the shape of the connector. As one example, the connector may protrude further upward than an upper surface of the printed circuit board.

In the case as the above, the thickness of the display apparatus is increased as much as the connector protrudes, and to compensate, that is resulting from the above issue, a spacer member may need to be attached to the printed circuit board to stably support the optical members.

SUMMARY

Therefore, it is an aspect of the present disclosure to provide a display apparatus having an improved thickness thereof by removing a portion of the thickness that is increased as a connector mounted at a printed circuit board of a light source module is protruded further than an upper surface of the printed circuit board.

Additional aspects of the disclosure will be set forth in part in the description which follows and, in part, will be obvious from the description, or may be learned by practice of the disclosure.

In accordance with one aspect of the present disclosure, a display apparatus may include a liquid crystal panel to display images; a light source to supply light at the liquid crystal panel; and a printed circuit board having a light source embedding unit at which the light source is embedded, and a connector mounting unit at which a connector configured to connect to an outside circuit is mounted, and the printed circuit board is bent such that the connector mounting unit may be positioned lower than the light source embedding unit relative to the light source or offset from the light source embedding unit.

The printed circuit board may be bent such that the connector may not be protruded further upward than the height of an upper surface of the light source embedding unit or protrude past the light source embedding unit.

In accordance with another aspect of the present disclosure, a manufacturing method of a display apparatus may include a forming of a printed circuit board having a light source embedding unit at which a light source is mounted, and a connector mounting unit at which a connector configured to connect to an outside circuit is mounted while positioned lower than the light source embedding unit; a settling of the printed circuit board at a bottom chassis; and a settling of optical members at the printed circuit board.

The forming of the printed circuit board may include an accumulating of or assembling a metallic radiation panel, an insulation layer, and a copper layer by use of pressure; forming of a pattern by etching at the copper layer; and a bending of the printed circuit board.

The forming of the printed circuit board may include a bending of the metallic radiation panel; forming of a heat transferring layer by processing an anodization at a surface of the metallic radiation panel; a coating of the copper layer at the heat transferring layer; and a forming of a pattern by etching at the copper layer.

In accordance with another aspect of the present disclosure, a method for a display apparatus may include forming of a printed circuit board of the display apparatus, the board include a light source embedding portion forming a first plane and on which a light source is mounted on a top light source plane mounting surface and a connector mounting portion forming a second plane and in which a connector mounted and configured to connect to an outside circuit and having an edge of the connector mounting portion that is away from the border. The method includes bending the printed circuit board at a border between the light source embedding portion and the connector mounting portion to position the edge at a position offset from the top light source plane.

In accordance with one aspect of the present disclosure, a method for a display apparatus may include forming a printed circuit board with a light source plane coupled to a connector mounting plane at a border, and bending the printed circuit board in association the border where a top surface of a connector mounted in the connector mounting plane does not protrude past the light source plane.

According to another aspect of the present disclosure, a display apparatus may include a printed circuit board with a light source plane coupled to a connector mounting plane at a border with the printed circuit board being bent in association with the border, a light source disposed on the light source plane, a reflector disposed on the light source plane adjacent the light source, a light guide disposed on the reflector, a liquid crystal panel disposed adjacent the light guide to receive light from the light source through the light guide and a connector connected to the circuit board on the connector mounting plane with a connector body adjacent to the reflector sheet.

An apparatus, according to one aspect of the present disclosure, includes a printed circuit board with a light source plane coupled to a connector mounting plane at a border with the printed circuit board being bent in association with the border. The bending according to an aspect of the present disclosure may comprise one of angular shaped bending at the border, a round shape at the border and a curved shape bending of connector mounting plane.

In accordance with one aspect of the present disclosure, a method for a display apparatus may include forming of a printed circuit board of for the apparatus, the board including a light source embedding portion forming a first plane and on which a light source is mounted on a top light source plane mounting surface, a step portion coupled to the light source embedding portion and a connector mounting portion coupled to the step portion and forming a second plane and in which a connector is mounted and configured to connect to an outside, where the printed circuit board at the connector mounting portion to position the edge at a position offset from the top light source plane by the step portion.

According to one aspect of the present disclosure, a method for a display apparatus includes forming a printed circuit board with a light source plane coupled to a connector mounting plane at a border, and offsetting the printed circuit board in association the border where a top surface of a connector mounted in the connector mounting plane does not protrude past the light source plane.

In accordance with one aspect of the present disclosure, a display apparatus, may include a printed circuit board with a light source plane coupled to a connector mounting plane at a border with the printed circuit board being offset in association with the border, a light source disposed on the light source plane, a reflector disposed on the light source plane adjacent the light source, a light guide disposed on the reflector, a liquid crystal panel disposed adjacent the light guide to receive light from the light source through the light guide, and a connector connected to the circuit board on the connector mounting plane with a connector body adjacent to the reflector sheet.

According to one aspect of the present disclosure, an apparatus may include a printed circuit board with a light source plane coupled to a connector mounting plane at a border with the printed circuit board being offset in association with the border.

In accordance with an aspect of the present disclosure, a slimization of a display apparatus may be provided.

In accordance with an aspect of the present disclosure, the number of parts and the assembly process may be reduced by omitting a spacer member, which is attached at a printed circuit board of a light source module as to compensate a step as a result of a protrusion of a connector.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
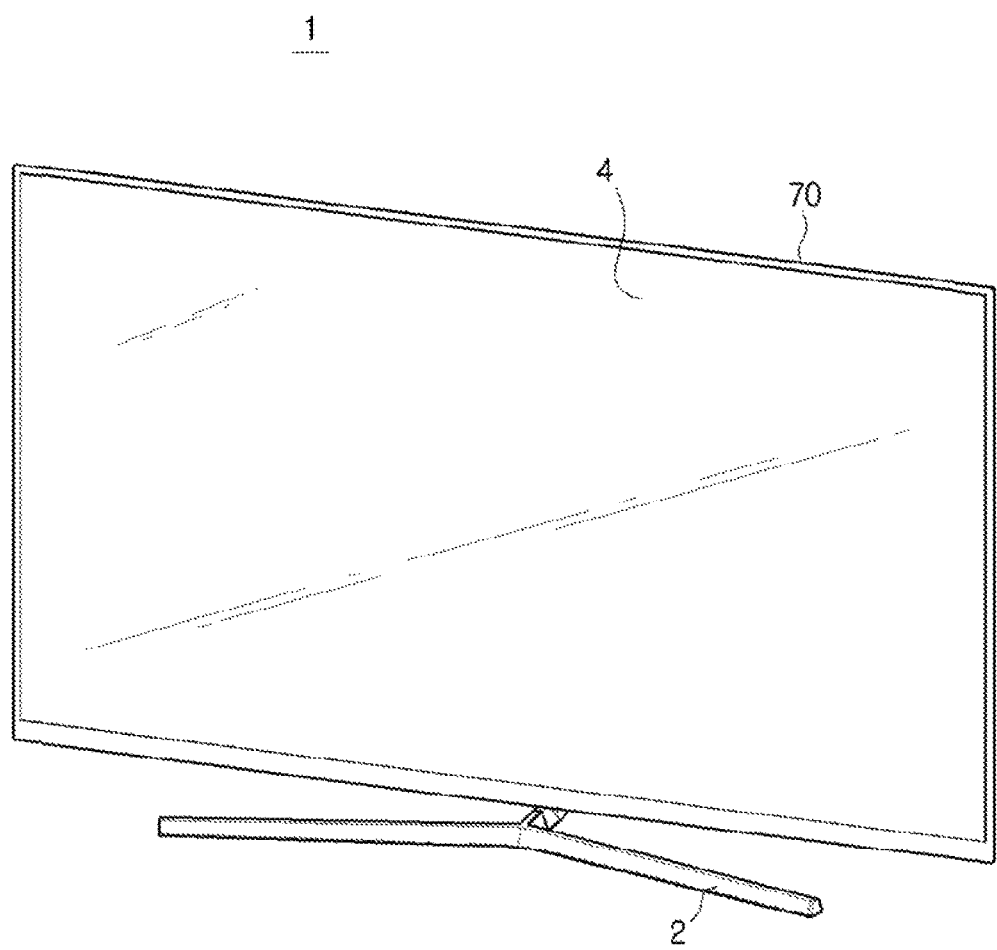
FIG. 1 is a drawing illustrating a display apparatus according to a first embodiment of the present disclosure.

Reference will now be made in detail to the embodiments of the present disclosure, examples of which are illustrated in the accompanying drawings, wherein like reference numerals refer to like elements throughout.

The embodiments provided in the present disclosure are presented as the most preferable embodiments of the present disclosure, not as the representations of all the technical aspects of the present disclosure, and therefore, various equivalents or modified examples that may replace the embodiments as such should be understood as included in the scope of the present disclosure.

With respect to the identical components on the drawings, the same numeral has been given, and each drawing may be illustrated in an expanded or exaggerated manner to a certain degree as to provide easier understanding of the present disclosure.

Unless otherwise defined in the present disclosure, all the terminologies that are used in the present disclosure, including technical or scientific terminologies, should be interpreted as the terminologies that are identical in terms of their definitions generally appreciated by those skilled in the art.

However, the terminologies that are separately defined in the present disclosure should not be limitedly interpreted as conventional or dictionary definitions, and on the basis of the principle that the terminologies may be defined accordingly as to describe the present disclosure with the best possible methods, the terminologies used in the present disclosure should be interpreted by use of the definitions and concepts that are in accordance with the technical aspects of the present disclosure.

Terms containing numerals such as "the first," "the second," etc. may be used in describing various elements of structures, and the elements of structures described are not limited to the terms described. The terms described may be used for the purpose of distinguishing one single element of structure from another element of structure.

A singular expression of a term includes plural expression of the term unless otherwise specified differently.

The term such as "include(s)" or "have (has)" in the present disclosure is provided as to clarify the presence of a certain characteristic, figure, motion, component, or part, or a combination of such, and the use of the term as such should be understood that the presence or the possibility of adding one or more of the certain characteristic, figure, motion, component, or part, or the combination of such is not to be excluded beforehand.

Figure 3:
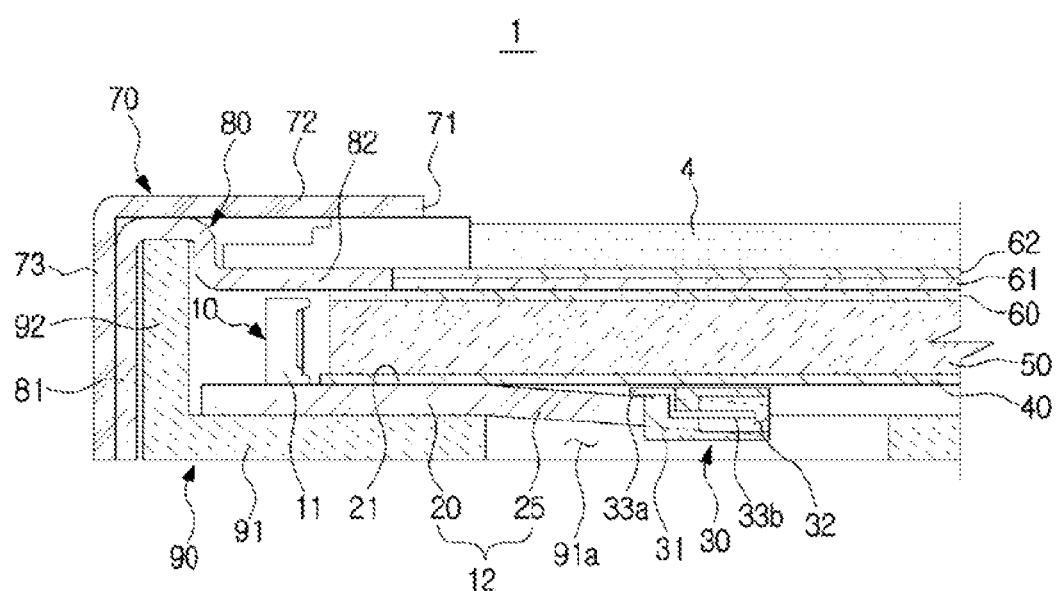
FIG. 3 is a schematic side cross-sectional view of the display apparatus of FIG. 1.

FIG. 3 will be used as the reference of the upward/downward directions in the present disclosure.

In a case when simply describing directions by using a terminology such as "in front of," "at rear of," "upward," "downward," "to the left of," or "to the right of," not only the case when a certain component is provided "in the front of," "at the rear of," "upward," "downward," "to the left of," or "to the right of" another component, but also the case when a third component is present in between the above components is not excluded.

Figure 2:
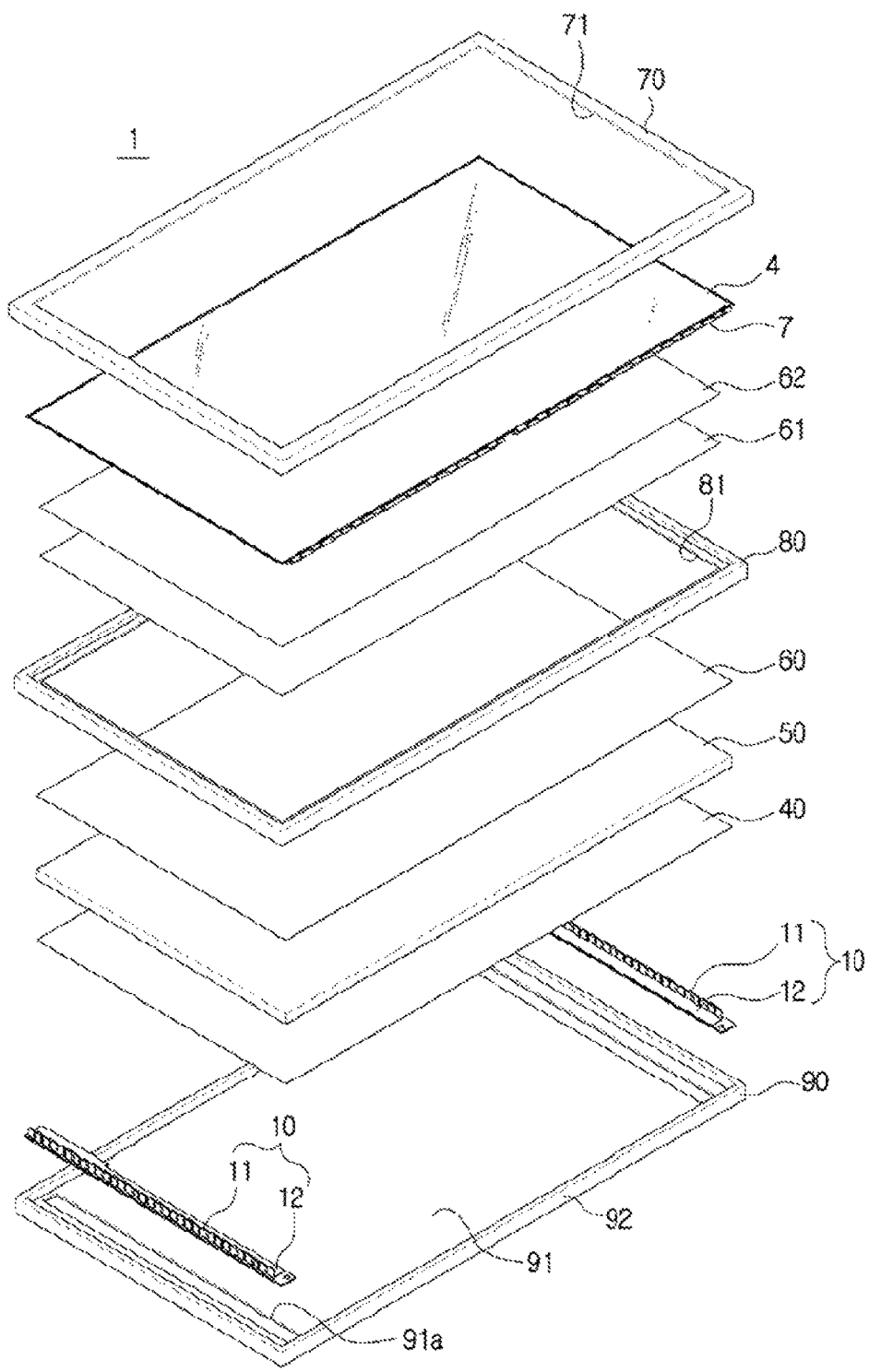
FIG. 2 is a drawing illustrating disassembled key structures of the display apparatus of FIG. 1.
Figure 4:
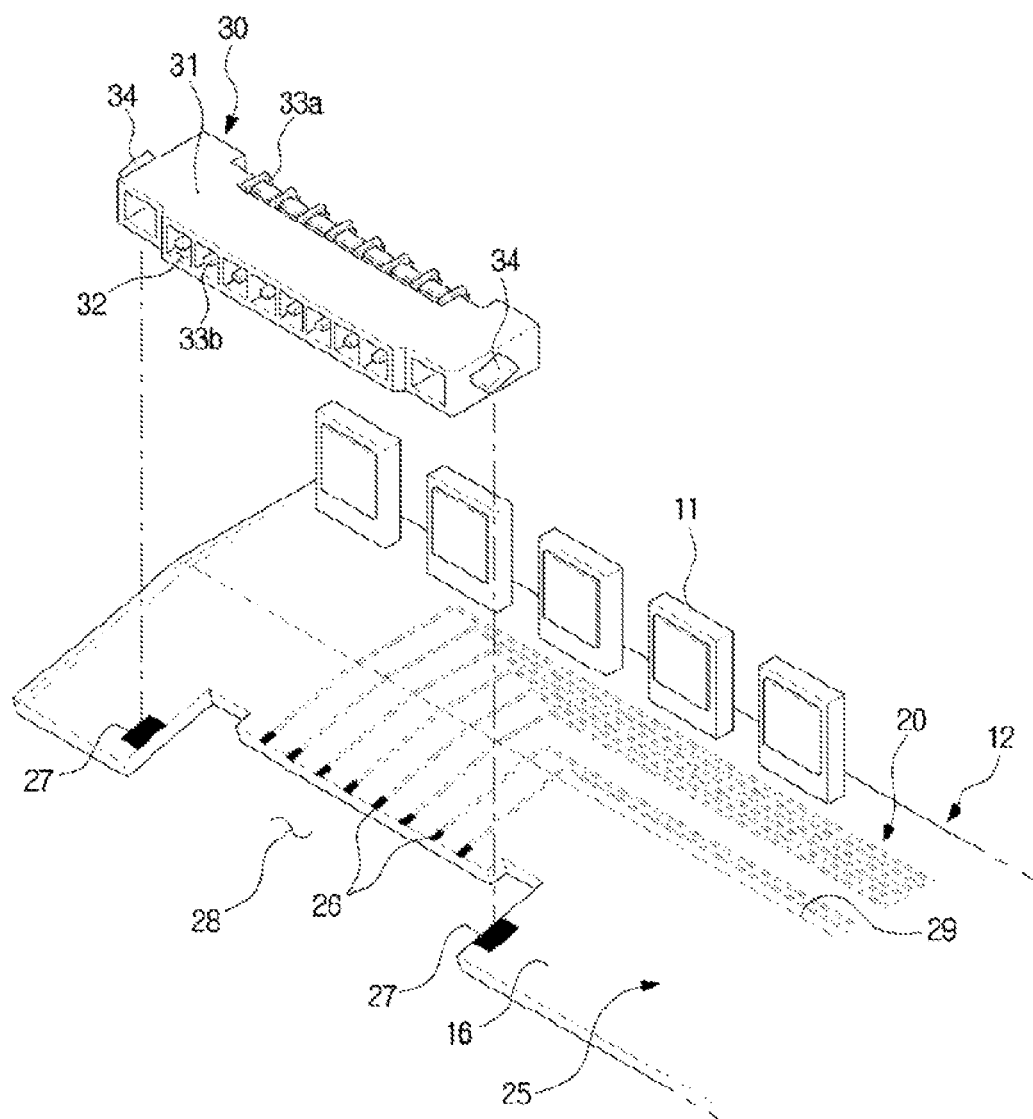
FIG. 4 is a drawing illustrating a printed circuit board and a connector of the display apparatus of FIG. 1 separated with respect to each other.
Figure 5:
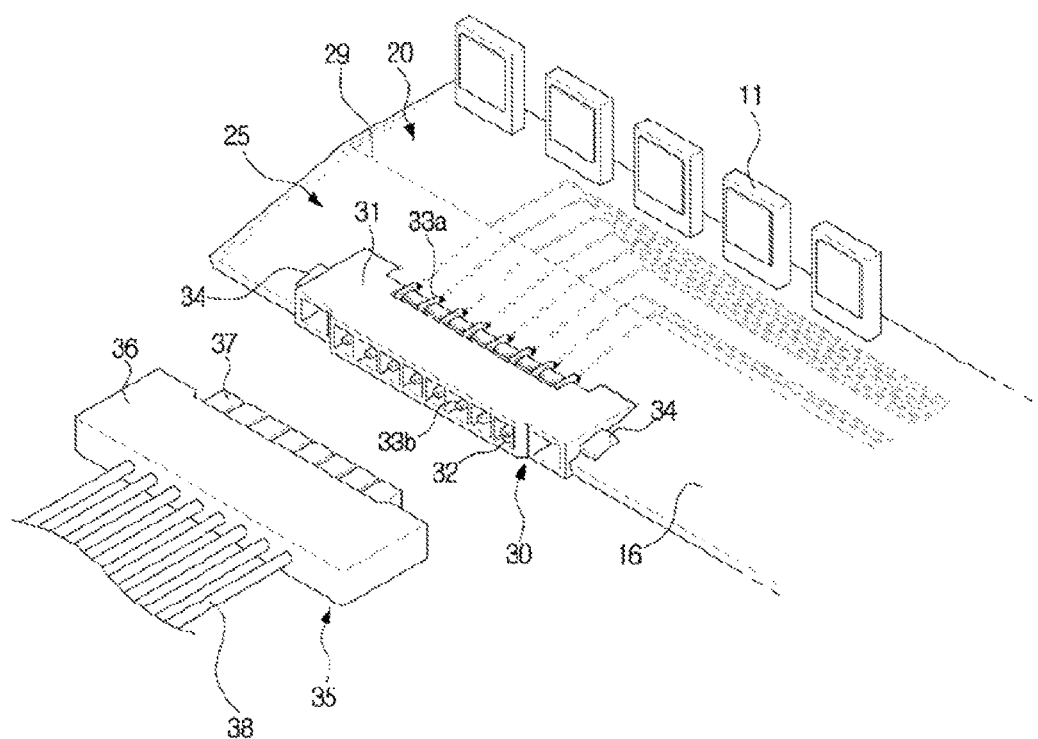
FIG. 5 is a drawing illustrating a state of the connector mounted at the printed circuit board of the display apparatus of FIG. 1.

FIG. 1 is a drawing illustrating a display apparatus according to a first embodiment of the present disclosure, FIG. 2 is a drawing illustrating disassembled key structures of the display apparatus of FIG. 1, FIG. 3 is a schematic side cross-sectional view of the display apparatus of FIG. 1, FIG. 4 is a drawing illustrating a printed circuit board and a connector of the display apparatus of FIG. 1 separated with respect to each other, and FIG. 5 is a drawing illustrating a state of the connector mounted at the printed circuit board of the display apparatus of FIG. 1.

A display apparatus 1 is an apparatus configured to display information, material, and data in the form of texts, geometric figures, graphs, and image, and includes a television, which is a remote communication medium configured to transmit videos and image signals, and a monitor, which is a type of a computer output apparatus.

The display apparatus 1 may be a flat surface display apparatus provided with a flat-surface screen as in the present embodiment, a curved surface display apparatus provided with a curved-surface screen different from the present disclosure, or a bendable display apparatus provided with a screen varied from a flat surface to a curved surface, from a curved surface to a flat surface, or the curvature of the curved surface thereof varied.

The display apparatus 1 includes a liquid crystal panel 4 to display images as a display unit of the display apparatus 1, and a backlight unit to radiate light at the liquid crystal panel 4.

The liquid crystal panel 4 may display images by use of liquid crystal configured to show optical characteristics according to the changes of voltage and temperature. The liquid crystal panel 4 may be structured with a thin film transistor (TFT) board, a color filter board coupled to the thin film transistor board as to face each other, and liquid injected in between the thin film transistor board and the color filter board. The thin film transistor board may be a transparent board having the thin film transistor, which is a switching terminal, formed in the shape of a matrix, and the color filter board may be a transparent board having a RGB pixel, which is a color pixel to radiate a predetermined color, formed by use of thin film processing.

The liquid crystal panel 4 may be provided with a signal transmitting film 7 connected thereto as to be authorized with a date driving signal and a gate driving signal. The signal transmitting film 7 may be structured in the form of a COF (Chip On Flexible Printed Circuit) having a driving chip embedded at a flexible printed circuit board.

The backlight unit may radiate light toward the liquid crystal panel 4 while disposed below the liquid crystal panel 4.

The backlight unit may be an edge type having a light source 11 disposed at least at a certain one side of a plurality of long sides and a plurality of short sides of the liquid crystal panel 4 as illustrated in the embodiment of the present disclosure, or a direct type having the light source 11 disposed directly below the liquid crystal panel 4 differently from the embodiment of the present disclosure.

The backlight unit includes a light source module 10 having the light source 11 and a printed circuit board 12 at which the light source 11 is embedded, and various optical members disposed on the moving path of the light radiated from the light source 11.

The light source 11 includes a LED (Light Emitting Diode). The LED may be provided in the form of package of having a LED chip embedded at a board and resin filled. However, differently from the embodiment of the present disclosure, a CCFL (Cold Cathode Fluorescent Lamp) or an EEFL (External Electrode Fluorescent Lamp) may be used as the light source.

The printed circuit board 12 may be provided with the plurality of light sources 11 embedded thereto in a row following the edges of the liquid crystal panel 4. The printed circuit board 12 may be provided with a circuit pattern formed thereto as to deliver driving power and signals to the light source 11, and may also be provided with a connector 30 mounted thereto as to connect to an outside circuit. The printed circuit board 12 may be settled at a bottom chassis 90, which is to be described later.

The printed circuit board 12 includes a light source embedding unit 20, which is a portion at which the light source 11 is embedded, and a connector mounting unit 25, which is a portion at which the connector 30 is mounted. The light source embedding unit 20 and the connector mounting unit 25 may be independently formed with respect to each other. The light source embedding unit 20 may be positioned at an outer side of the display apparatus 1 with respect to the connector mounting unit 25.

The printed circuit board 12 is bent while having a bent unit or point 29, which is a border line of the light source embedding unit 20 and the connector mounting unit 25, as a center such that the connector mounting unit 25 may be present or positioned at a lower position than the light source embedding unit 20.

With the above, the connector 30 mounted at the connector mounting unit 25 may be positioned to not be higher than the height of an upper surface 21 of the light source embedding unit 20. That is, the connector 30 may not protrude above the upper surface of the light source embedding unit 20. With respect to the printed circuit board 12 and the connector 30, the detailed descriptions will be provided later.

The optical member may guide moving direction of the light or enhance optical characteristics while disposed on the moving path of the light radiated form the light source 11.

The optical member includes a reflector sheet 40 (see FIG. 3) to prevent light loss by reflecting the light, a light guide plate 50 to evenly disperse the light radiated from the light source 11 toward the liquid crystal panel 4, and various optical sheets 60, 61, and 62 to enhance optical characteristics.

The reflector sheet 40 may incident the light, which is radiated from the light source 11, at a lower surface of the light guide plate 50 by reflecting the light. The reflector sheet 40 may be formed in various shapes such as a sheet, a film, or a panel. As one example, the reflector sheet 40 may be formed by coating at base material with material having high reflexibility. As for the base material, SUS, BRASS, or PET may be used, and Silver or TiO2 may be used as high reflexibility coating material.

The reflector sheet 40 may be supported while settled at the light source embedding unit 20 of the printed circuit board 12.

The light guide plate 50 may be formed by use of PMMA (Poly Methyl Methacrylate Acrylate) material. The light guide plate 50 may be provided with a pattern to change the path of light. The light source 11 may be positioned at a side surface of the light guide plate at the edge type backlight unit as in the embodiment of the present disclosure. The light incident at the side surface of the light guide plate 50 is scattered at the pattern formed at a lower surface of the light guide plate, and may exit through an upper surface of the light guide plate.

The light guide plate 50 may be settled at the reflector sheet 40. The light guide plate 50 may be disposed such that a side surface of the light guide plate 50 is spaced apart with respect to the light source 11 considering heat expansion.

The optical sheets 60, 61, and 62 may be disposed at an upper portion of the light guide plate 50 as to enhance optical characteristics of the light being exited from the light guide plate 50.

The optical sheets 60, 61, and 62 may be structured with a quantum dot sheet 60, a diffuser sheet 61, and a prism sheet 62.

The quantum dot sheet 60 may enhance color reproducibility by changing the wavelength of light. The color reproducibility is regarded as a measurement to determine how close the color of light is to natural color, and provided to measure the range of area on the color coordinate the color of the light may reproduce.

The quantum dot sheet 60 is provided with quantum dots, which are semiconductor crystals each radiating light while having a size of several nanometers, dispersedly disposed at an inside thereof. The quantum dot may generate all colors of visible ray by receiving blue light according to the size of the quantum dot. The light having shorter wavelength is generated as the size of the quantum dot is smaller, and the light having longer wavelength is generated as the size of the quantum dot is larger.

The diffuser sheet 61 may offset or minimize the pattern of the light guide plate 50. The light guided through the light guide plate 50 is directly entered into an eye, and the pattern of the light guide plate 50 is reflected as it is on the eye, and thus the diffuser sheet 61 is provided to offset or minimize the pattern of the light guide plate 50.

The prism sheet 62 may enhance the brightness of light by concentrating the light again, as the light is provided with rapidly reduced brightness while passing through the diffuser sheet. As for the prism sheet 62, a DBFF (Dual Brightness Enhancement Film), which is a high brightness prism sheet, may be used as the prism sheet 62.

However, differently from the embodiment of the present disclosure, the optical sheets may further include a protection sheet as to protect the optical sheets from an impact of an outside or an introduction of foreign substance. In addition, a certain one of the quantum dot sheet, the diffuser sheet, and the prism sheet may be omitted, and a compound sheet provided with at least one performance combined may be used.

The optical sheets 60, 61, and 62 may be disposed in between the light guide plate 50 and the liquid crystal panel 4.

The display apparatus 1 includes a chassis assembly to accommodate and support the liquid crystal panel 4 and the backlight unit.

The chassis assembly may be structured with a top chassis 70, a middle mold 80, and the bottom chassis 90.

The top chassis 70 may include an opening 71 to expose the liquid crystal panel 4, a bezel unit 72 to support an edge unit of an upper surface of the liquid crystal panel 4, and a top chassis side unit 73 extended downward from the bezel unit 72.

The middle mold 80 may include a middle mold side unit 81, and a middle support unit 82 to support the liquid crystal panel 4 and the optical members and maintain gaps between the liquid crystal panel 4 and the optical members while protruded toward an inner side from the middle mold side unit 81.

The bottom chassis 90 may include a bottom unit 91 disposed below the backlight unit, and a bottom side unit 92 extended upward from the bottom unit 91. The bottom unit 91 may be provided with the printed circuit board 12 of the light source module 10 settled thereto.

The bottom chassis 90 may be provided with various components of the display apparatus 1 including the top chassis 70 and the middle mold 80 fixedly supported thereto.

The bottom chassis 90 may perform a role to radiate the heat generated at the light source 11 to an outside. That is, the heat generated at the light source 11 is delivered to the bottom chassis 90 through the printed circuit board 12, and may be radiated at the bottom chassis 90. For the above, the bottom chassis 90 may be formed with various metallic material having high thermal conductivity including aluminum and SUS, or plastic material including ABS. In addition, the printed circuit board 12 as well may be provided with metallic PCB of metallic material having high thermal conductivity.

However, differently from the embodiment of the present disclosure, a certain one of the top chassis 70, the middle mold 80, and the bottom chassis 90 may be omitted, or the top chassis 70, the middle mold 80, and the bottom chassis 90 may integrally be formed with respect to each other.

The display apparatus 1 may further include a housing (not shown), as to protect and accommodate the chassis assembly as such, to wrap around the chassis assembly.

The display apparatus 1 may be provided with legs 2 such that the display apparatus 1 may be installed at a floor surface. However, differently from the embodiment of the present disclosure, the display apparatus 1 may be provided to be suspended on a wall or installed at an inside of a wall by use of a built-in method.

As the above, the display apparatus 1 may be provided thereof with the bottom chassis 90, the printed circuit board 12 of the light source module 10, the reflector sheet 40, the light guide plate 50, the optical sheets 60, 61, and 62, and the liquid crystal panel 4 horizontally accumulated or combined in the order of which the above are described. In the case as the above, if the connector 30 mounted at the printed circuit board 12 is protruded higher than the upper surface of the printed circuit board 12, the thickness of the display apparatus 1 may be increased as much.

Therefore, as described above, the printed circuit board 12 according to the embodiment of the present disclosure, as to improve the thickness of the display apparatus 1 by removing the protrusion of the connector 30, is bent while having the bent unit 29 (or bend point or bend line), which is a border line of the connector mounting unit 25 and the light source embedding unit 20, as a bending center, such that the connector mounting unit 25 may be positioned lower than the light source embedding unit 20.

The printed circuit board 12 is bent such that the connector 30 mounted at the connector mounting unit 25 may be disposed at a position that is at least not higher than the upper surface 21 of the light source embedding unit 20.

The light source embedding unit 20 while having a plane shape may be provided to be approximately horizontal with respect to the liquid crystal panel 4, and the connector mounting unit 25 while having a plane shape may be formed in an angular manner as to form a predetermined angle with respect to the light source embedding unit 20.

The bottom chassis 90 may be provided with an accommodation unit 91*a* to accommodate the connector mounting unit 25. The accommodation unit 91*a* may be formed at the bottom unit 91 of the bottom chassis 90. Therefore, the light source embedding unit 20 of the printed circuit board 12 is supported at the bottom unit 91, and the connector mounting unit 25 of the printed circuit board 12 is accommodated at the accommodation unit 91*a*.

The accommodation unit 91*a* in the present embodiment is provided in the shape of an opening penetrating through the bottom unit 91, but is not limited hereto, and may be provided in the shape of a groove.

The printed circuit board 12 according to the embodiment of the present disclosure may be bent as much such that the connector 30 mounted at the connector mounting unit 25 may be adequately positioned at a position that is at least not higher than the upper surface 21 of the light source embedding unit 20, and no limitation is present with respect to the material, form, number of layers of the printed circuit board 12 as well as the shape of the connector 30.

As one example, the printed circuit board 12 may be a metallic printed circuit board having a metallic radiation panel, a flexible board having polyimide material, or a rigid panel of epoxy material. In addition, the printed circuit board 12 may be a single-side PCB, a double-side PCB, or a multi-layer PCB.

As one example, the connector 30 may include a connector body 31, an insertion space 32 formed at an inside of the connector body 31, a connection pin 33*b* provided at the insertion space 32, an access pin 33*a* extended from the connection pin 33*b* to an outside from the connection pin 33*b* to be accessed to an access lead 26 of the printed circuit board 12, and an access terminal 34 (see FIGS. 4 and 5) formed at an outside of the connector body 31 as to be embedded at a connecting pad 27 of the printed circuit board 12.

The printed circuit board 12 includes a protective layer 16 provided at a copper layer forming a circuit pattern, and may be provided in a form such that the access lead 26 and the connecting pad 27 are exposed while a portion of the protective layer 16 is open.

A plug 35 connected to the connector 30 may include a plug body 36, and an insertion unit 37 having a connection terminal (not shown) inserted into the insertion space 32 of the connector 30 and accessed at the connection pin 33*b* of the connector 30. The plug 35 may be provided with a wire 38 connected thereto.

The printed circuit board 12 may be a single side PCB having a circuit pattern formed at an upper surface thereof, and accordingly, the access pin 33*a* may be provided at the upper surface of the printed circuit board 12.

The printed circuit board 12 may be provided with the connector mounting unit 25 having a settling space 28 at which the connector 30 is accommodated formed thereto. At least a portion of the connector 30 is accommodated at the settling unit 28, while at least another portion of the connector 30 may be protruded upward without being accommodated.

Nevertheless, since the connector mounting unit 25 is being positioned below the light source embedding unit 20 as the printed circuit board 12 is bent at the bent unit 29, which is the border line of the connector mounting unit 25 and the light source embedding unit 20, the connector 30 may not be positioned higher than the upper surface 21 of the light source embedding unit 20.

As the above, since no step is generated from the protrusion of the connector 30 as the connector 30 is positioned not to be higher than the upper surface 21 of the light source embedding unit 20, the thickness of the display apparatus 1 may be improved, and since a spacer member, which is conventionally attached to the printed circuit board 12 as to compensate the step resulted from the protrusion of the connector 30, may be omitted, the number of parts and assembly process may be reduced.

Figure 6:
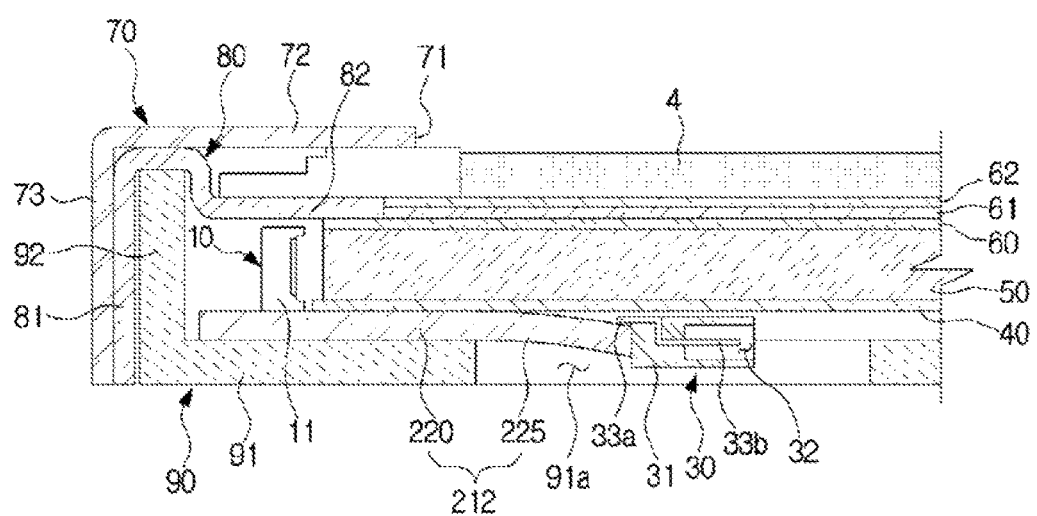
FIG. 6 is a schematic side cross-sectional view of a display apparatus according to a second embodiment of the present disclosure.

FIG. 6 is a schematic side cross-sectional view of a display apparatus according to a second embodiment of the present disclosure.

Referring to FIG. 6, a display apparatus 200 according to the second embodiment of the present disclosure will be described. With respect to the identical components that are described in the previously described embodiment, the same numerals will be assigned while the descriptions thereof may be omitted.

A printed circuit board 212 is bent while having a border line of a connector mounting unit 225 and a light source embedding unit 220 as a center such that the connector mounting unit 225 may be positioned lower than the light source embedding unit 220, and the degree of the bending may be adequate as long as the connector 30 mounted at the connector mounting unit 225 is at least not higher than an upper surface of the light source embedding unit 220, and the above are identical to the previously described embodiment.

However, the connector mounting unit 225, differently from the previously described embodiment, may be extended in a round manner at the light source embedding unit 220.

The light source embedding unit 220 may be provided with the shape of a plane surface and approximately horizontal with respect to the liquid crystal panel 4, or the light source embedding unit 220 may be provided with the shape of a curved surface other than the shape of the plane surface.

Since the light source embedding unit 220 is extended in a round manner at the connector mounting unit 225 and provided with the shape of the curved surface, the processing of the light source embedding unit 220 may be easier when compared to the previously described embodiments.

Figure 7:
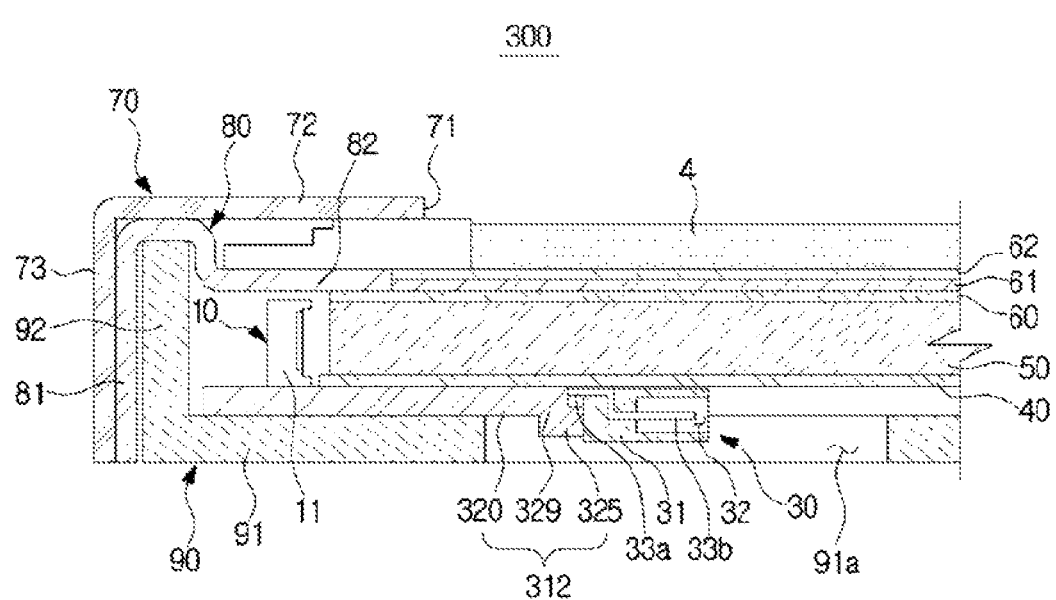
FIG. 7 is a schematic side cross-sectional view of a display apparatus according to a third embodiment of the present disclosure.

FIG. 7 is a schematic side cross-sectional view of a display apparatus according to a third embodiment of the present disclosure.

Referring to FIG. 7, a display apparatus 300 according to the second embodiment of the present disclosure will be described. With respect to the identical components that are described in the previously described embodiments, the same numerals will be assigned while the descriptions thereof may be omitted.

A printed circuit board 312 is bent while having a border line of a connector mounting unit 325 and a light source embedding unit 320 as a center such that the connector mounting unit 325 may be positioned lower than the light source embedding unit 320, and the degree of the bending may be adequate as long as the connector 30 mounted at the connector mounting unit 325 is at least not higher than an upper surface of the light source embedding unit 320, and the above are identical to the previously described embodiments.

However, the printed circuit board 312 may further include a step unit 329 connecting the connector mounting unit 325 and the light source embedding unit 320.

The light source embedding unit 320, as well as the connector mounting unit 325, is provided with the shape of a plane surface, and may be approximately horizontal with respect to the liquid crystal panel 4. The step unit 329 may be perpendicularly provided as to connect the connector mounting unit 325 and the light source embedding unit 320.

However, differently from the present embodiment, the light source embedding unit 320 and the step unit 329 may be extended in a round manner, and the step unit 329 and the connector mounting unit 325 as well may be extended in a round manner.

Figure 8:
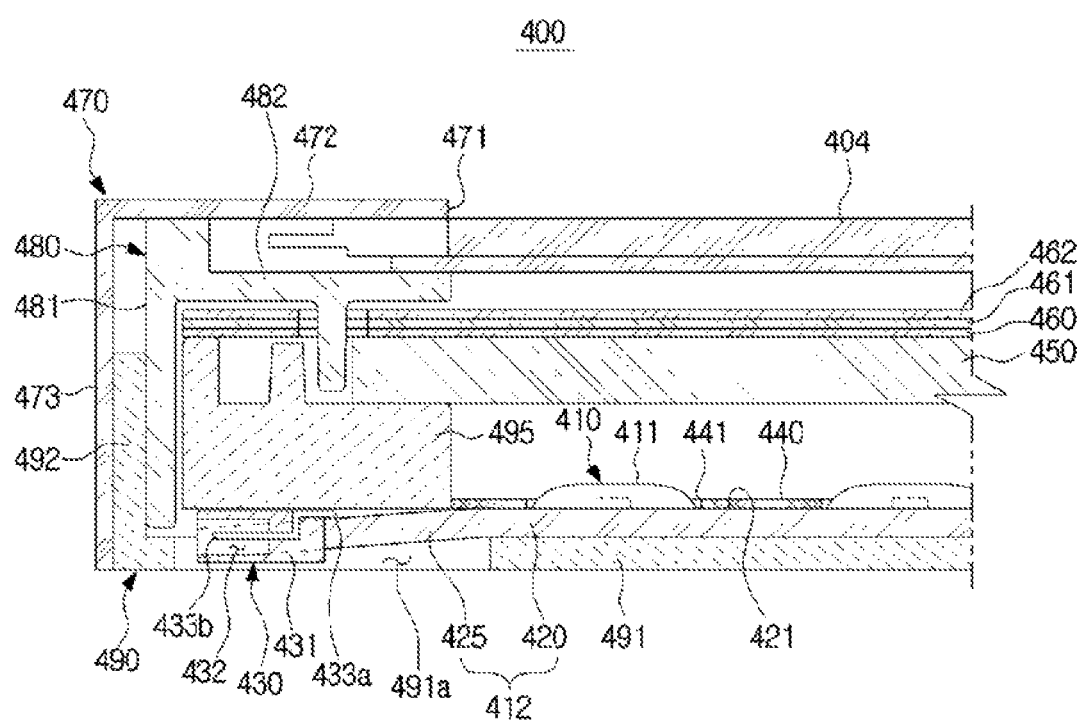
FIG. 8 is a schematic side cross-sectional view of a display apparatus according to a fourth embodiment of the present disclosure.

FIG. 8 is a schematic side cross-sectional view of a display apparatus according to a fourth embodiment of the present disclosure.

Referring to FIG. 8, a display apparatus 400 according to the second embodiment of the present disclosure will be described. With respect to the identical components that are described in the previously described embodiments, the same numerals will be assigned while the descriptions thereof may be omitted.

The present embodiment is provided to show the display apparatus 400 having a direct type backlight unit, and the backlight unit includes a light source module 410 structured with a light source 411 and a printed circuit board 412 at which the light source 411 is embedded, and various optical members disposed on the moving path of the light radiated from the light source 411.

The printed circuit board 412 may be provided with the plurality of light sources 411 embedded thereto while the plurality of light sources 411 is embedded in line along the lengthways direction of the printed circuit board 412. The printed circuit board 412 may be provided with a circuit pattern formed thereto as to deliver driving power and signals to the light source 411, and may also be provided with a connector 430 configured to connect to an outside circuit. The printed circuit board 412 may be settled at a bottom chassis 490.

The printed circuit board 412 includes a light source embedding unit 420, which is a portion at which the light source 411 is embedded, and a connector mounting unit 425, which is a portion at which the connector 430 is mounted. The light source embedding unit 420 and the connector mounting unit 425 may be independently formed with respect to each other. The connector mounting unit 425 with respect to the light source embedding unit 420 may be positioned further toward an outer side of the display apparatus 400.

The printed circuit board 412 is bent while having a bent unit, which is a border line of the light source embedding unit 420 and the connector mounting unit 425, as a center, such that the connector mounting unit 425 may be positioned lower than the light source embedding unit 420. The connector 430 mounted at the connector mounting unit 425 may be positioned not to be higher than the height of an upper surface 421 of the light source embedding unit 420.

The optical member includes a reflector sheet 440 to prevent light loss by reflecting the light, a light guide plate 450 to evenly disperse the light radiated from the light source 411 toward a liquid crystal panel 404, and various optical sheets 460, 461, and 462 to enhance optical characteristics.

The reflector sheet 440 may incident the light, which is radiated from the light source 411, at a lower surface of the light guide plate 450 by reflecting the light. The reflector sheet 440 may be formed in various shapes such as a sheet, a film, or a panel.

The reflector sheet 440 may be supported while settled at the light source embedding unit 420 of the printed circuit board 412. The reflector sheet 440 may be provided with a penetration hole 441 such that the light source 411 embedded at the printed circuit board 412 may penetrate.

The light guide plate 450 may be used in place of a light guide panel at the direct type backlight unit, and may perform a role to diffuse the uneven light generated at the light source 411 and support the various optical sheets 460, 461, and 462 while disposed at an upper side of the reflector sheet 440.

The optical sheets 460, 461, and 462 may be structured with a quantum dot sheet 460, a diffuser sheet 461, and a prism sheet 462.

However, differently from the present embodiment, the optical sheets may further include a protection sheet as to protect the optical sheets from an impact of an outside or an introduction of foreign substance. In addition, a certain one of the quantum dot sheet, the diffuser sheet, and the prism sheet may be omitted, and a compound sheet provided with at least one performance combined may be used.

The optical sheets 460, 461, and 462 may be disposed in between the light guide plate 450 and the liquid crystal panel 404.

The display apparatus 400 further includes a chassis assembly to accommodate and support the liquid crystal panel 404 and the backlight unit.

The chassis assembly may be structured with a top chassis 470, a middle mold 480, and a bottom chassis 490, and a holder middle 495.

The top chassis 470 may include an opening 471 to expose the liquid crystal panel 404, a bezel unit 472 to support an edge unit of an upper surface of the liquid crystal panel 404, and a top chassis side unit 473 extended downward from the bezel unit 472.

The middle mold 480 may include a middle mold side unit 481, and a middle support unit 482 to support the liquid crystal panel 404 and the optical members and maintain gaps between the liquid crystal panel 404 and the optical members while protruded toward an inner side from the middle mold side unit 481.

The bottom chassis 490 may include a bottom unit 491 disposed below the backlight unit, and a bottom side unit 492 extended upward from the bottom unit 491. The bottom unit 491 may be provided with the printed circuit board 412 of the light source module 410 settled thereto.

The bottom chassis 490 may be provided with various components of the display apparatus 400 including the top chassis 470 and the middle mold 480 fixedly supported thereto.

The bottom chassis 490 may perform a role to radiate the heat generated at the light source 411 to an outside. For the above, the bottom chassis 490 may be formed with various metallic material having high thermal conductivity including aluminum and SUS, or plastic material including ABS.

The holder middle 495 may perform a role to fix the reflector sheet 440, space apart the light guide plate 450 from the reflector sheet 440, and support the light guide plate 450 and the optical sheets 460, 461, and 462 while provided at an upper portion of the bottom chassis 490.

However, differently from the embodiment of the present disclosure, a certain one of the top chassis 470, the middle mold 480, the bottom chassis 490, and the holder middle 495 may be omitted, or the top chassis 470, the middle mold 480, the bottom chassis 490, and the holder middle 495 may integrally be formed with respect to each other.

The light source embedding unit 420 may be provided with the shape of a plane surface and approximately horizontal with respect to the liquid crystal panel 404, and the connector mounting unit 425 while having a plane shape may be formed in an angular manner as to form a predetermined angle with respect to the light source embedding unit 420.

The bottom chassis 490 may be provided with an accommodation unit 491a to accommodate the connector mounting unit 425 that is bent at the light source embedding unit 420 and positioned at a lower portion. The accommodation unit 491a may be formed at the bottom unit 491 of the bottom chassis 490. The light source embedding unit 420 of the printed circuit board 412 is supported at the bottom unit 491, and the connector mounting unit 425 of the printed circuit board 412 is accommodated at the accommodation unit 491a.

The accommodation unit 491a in the present embodiment is provided in the shape of an opening penetrating through the bottom unit 491, but is not limited hereto, and may be provided in the shape of a groove.

The printed circuit board 412 according to the embodiment of the present disclosure may be bent as much such that the connector 430 mounted at the connector mounting unit 425 may be adequately positioned at a position that is at least not higher than the upper surface 421 of the light source embedding unit 420, and no limitation is present with respect to the material, form, number of layers of the printed circuit board 412 as well as the shape of the connector 430.

As one example, the printed circuit board 412 may be a metallic printed circuit board having a metallic radiation panel, a flexible board having polyimide material, or a rigid panel of epoxy material. In addition, the printed circuit board 412 may be a single-side PCB, a double-side PCB, or a multi-layer PCB.

As one example, the connector 430 may include a connector body 431, an insertion space 432 formed at an inside of the connector body 431, a connection pin 433b provided at the insertion space 432, an access pin 433a extended from the connection pin 433b to an outside from the connection pin 433b to be accessed to an access lead of the printed circuit board 412, and an access terminal formed at an outside of the connector body 431 as to be embedded at a connecting pad of the printed circuit board 412.

Figure 9:
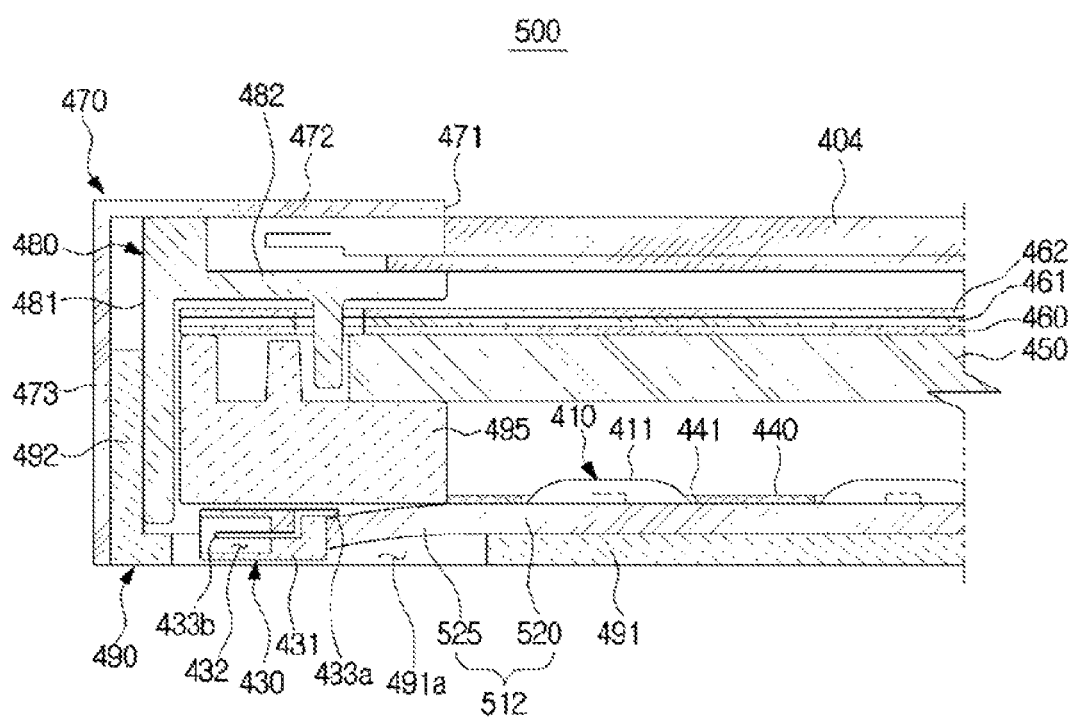
FIG. 9 is a schematic side cross-sectional view of a display apparatus according to a fifth embodiment of the present disclosure.

FIG. 9 is a schematic side cross-sectional view of a display apparatus according to a fifth embodiment of the present disclosure.

Referring to FIG. 9, a display apparatus 500 according to the second embodiment of the present disclosure will be described. With respect to the identical components that are described in the previously described embodiments, the same numerals will be assigned while the descriptions thereof may be omitted.

A printed circuit board 512 is bent while having a border line of a connector mounting unit 525 and a light source embedding unit 520 as a center such that the connector mounting unit 525 may be positioned lower than the light source embedding unit 520, and the degree of the bending may be adequate as long as a connector 530 mounted at the connector mounting unit 525 is at least not higher than an upper surface of the light source embedding unit 520, and the above are identical to the previously described embodiments.

However, differently from the previous embodiments, the printed circuit board 512 may be extended in a round manner at the light source embedding unit 520.

The light source embedding unit 520 may be provided with the shape of a plane surface and approximately horizontal with respect to the liquid crystal panel 404, or the light source embedding unit 520 may be provided with the shape of a curved surface other than the shape of the plane surface.

Since the light source embedding unit 520 is extended in a round manner at the connector mounting unit 525 and provided with the shape of the curved surface, the processing of the light source embedding unit 520 may be easier when compared to the previously described embodiments.

Figure 10:
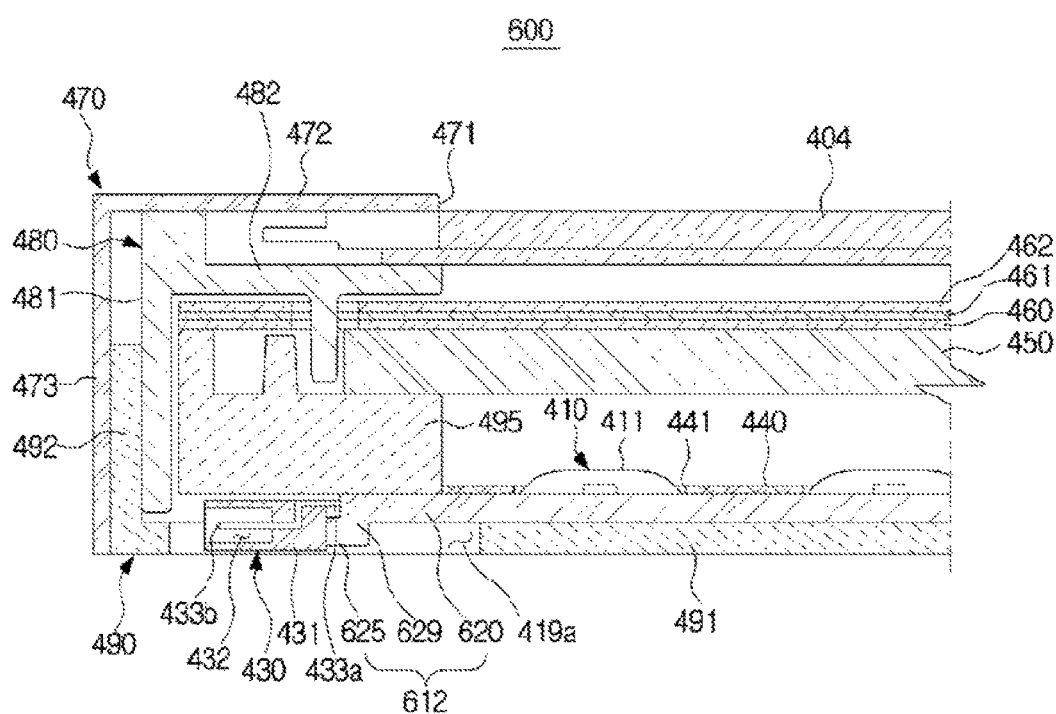
FIG. 10 is a schematic side cross-sectional view of a display apparatus according to a sixth embodiment of the present disclosure.

FIG. 10 is a schematic side cross-sectional view of a display apparatus according to a sixth embodiment of the present disclosure.

Referring to FIG. 10, a display apparatus 600 according to the second embodiment of the present disclosure will be described. With respect to the identical components that are described in the previously described embodiments, the same numerals will be assigned while the descriptions thereof may be omitted.

A printed circuit board 612 is bent while having a border line of a connector mounting unit 625 and a light source embedding unit 620 as a center such that the connector mounting unit 625 may be positioned lower than the light source embedding unit 620, and the degree of the bending may be adequate as long as a connector 630 mounted at the connector mounting unit 625 is at least not higher than an upper surface of the light source embedding unit 620, and the above are identical to the previously described embodiments.

However, the printed circuit board 612 may further include a step unit 629 connecting the connector mounting unit 625 and the light source embedding unit 620.

The light source embedding unit 620, as well as the connector mounting unit 625, is provided with the shape of a plane surface, and may be approximately horizontal with respect to the liquid crystal panel 404. The step unit 629 may be perpendicularly provided as to connect the connector mounting unit 625 and the light source embedding unit 620.

However, differently from the present embodiment, the light source embedding unit 620 and the step unit 629 may be extended in a round manner, and the step unit 629 and the connector mounting unit 625 as well may be extended in a round manner.

Figure 11:
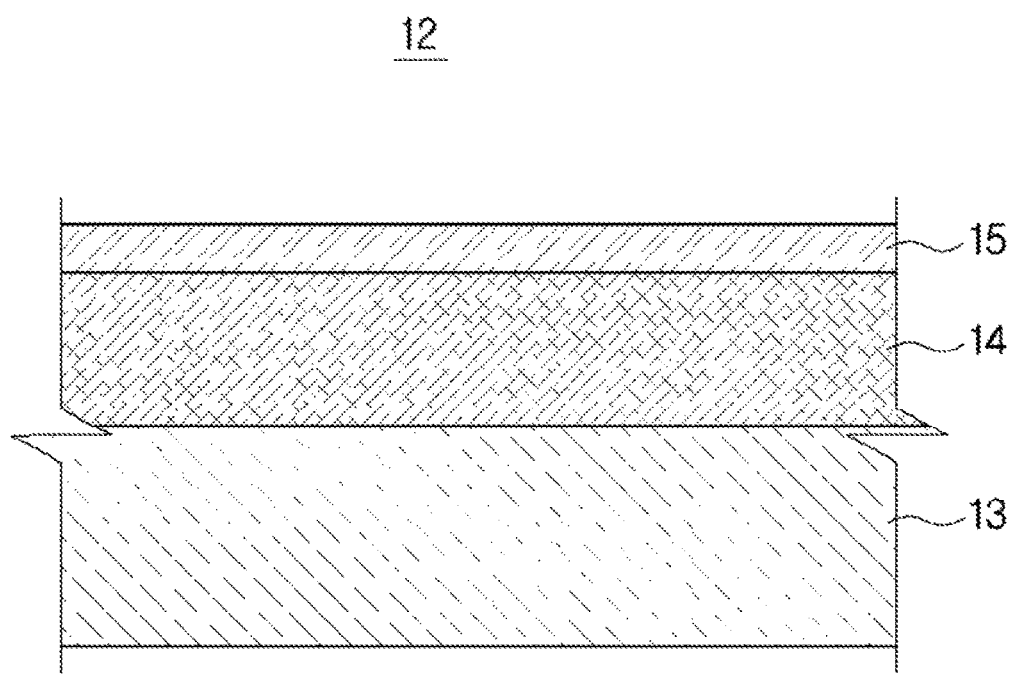
FIG. 11 is a drawing illustrating an accumulation or combined structure of a printed circuit board according to one embodiment of the present disclosure.
Figure 12:
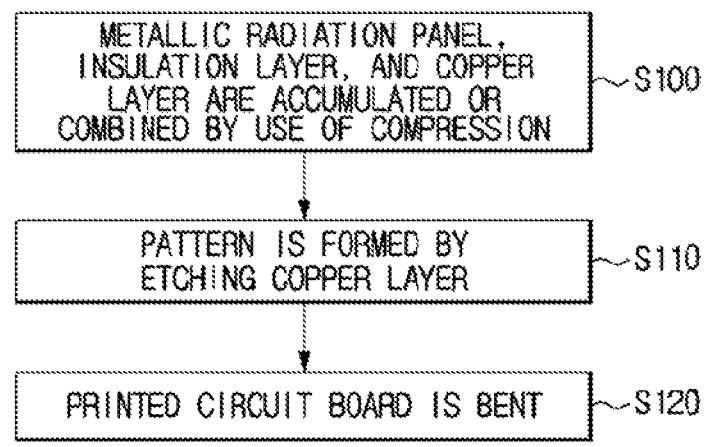
FIG. 12 is a drawing illustrating a bending method of the printed circuit board according to one embodiment of the present disclosure.

FIG. 11 is a drawing illustrating an accumulation or assembled structure of a printed circuit board according to one embodiment of the present disclosure, and FIG. 12 is a drawing illustrating a bending method of the printed circuit board according to one embodiment of the present disclosure.

Referring to FIG. 11 and FIG. 12, an accumulation structure of the printed circuit board according to one embodiment of the present disclosure, and a bending method of the printed circuit board and a manufacturing method of a display apparatus according to one embodiment of the present disclosure will be described.

The manufacturing method of the display apparatus includes a forming of a printed circuit board having a light source embedding unit at which a light source is embedded, and a connector mounting unit at which a connector configured to connect to an outside circuit is mounted and positioned lower than the light source embedding unit.

Next, a settling of the printed circuit board formed as the above at a bottom chassis, and settling of optical members including a reflector sheet at the printed circuit board settled at the bottom chassis are included.

At this time, a method of bending and forming the printed circuit board may vary depending on the structure of the printed circuit board.

As one example, as illustrated on FIG. 11, the printed circuit board 12 may be provided with a structure having a metallic radiation panel 13, an insulation layer 14, and a copper layer 15 in the order of which the above are described.

The metallic radiation panel 13 may be formed with aluminum material, and the insulation layer 14 may be formed with material such as epoxy or FR4. The insulation layer 14 may be provided above thereof with the protective layer 16 (FIG. 4) having white PSD (Photo Solder Resist) material.

The printed circuit board 12 may be formed by accumulating or combining the metallic radiation panel 13, the insulation layer 14, and the copper layer 15 by use of compression (S100).

Next, a circuit pattern may be formed through a masking and an etching process at the copper layer (S110), and the printed circuit board may be bent (S120).

Figure 13:
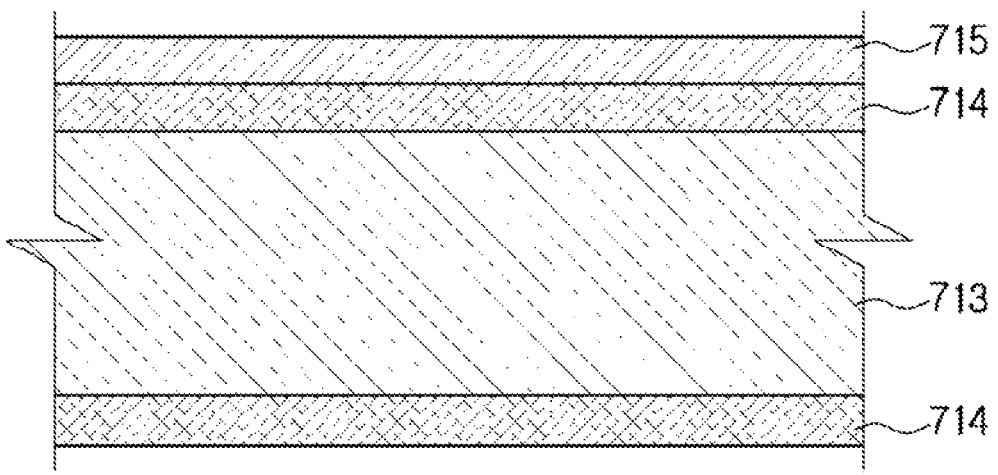
FIG. 13 is a drawing illustrating an accumulation or assembled structure of a printed circuit board according to another embodiment of the present disclosure.
Figure 14:
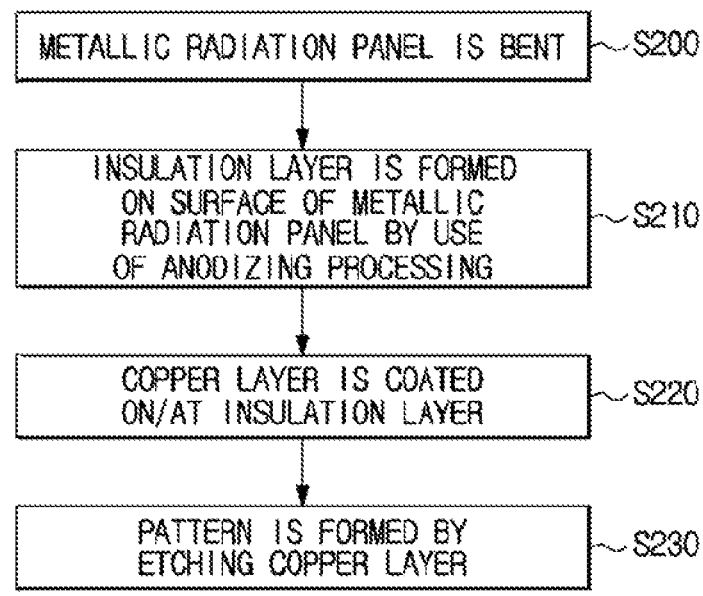
FIG. 14 is a drawing illustrating a bending method of the printed circuit board according to another embodiment of the present disclosure.

FIG. 13 is a drawing illustrating an accumulation structure of a printed circuit board according to another embodiment of the present disclosure, and FIG. 14 is a drawing illustrating a bending method of the printed circuit board according to another embodiment of the present disclosure.

Referring to FIG. 13 and FIG. 14, an accumulation structure of the printed circuit board according to another embodiment of the present disclosure, and a bending method of the printed circuit board and a manufacturing method of a display apparatus according to another embodiment of the present disclosure will be described. Descriptions with respect to the components that are identical to the previously described embodiments will be omitted.

A printed circuit board 712 may be formed by use of a coating method other than the compression method, which is described earlier. By use of the method as the above, the printed circuit board 712 may be provided with a structure of having a lower insulation layer 714, a metallic radiation panel 713, an upper insulation layer 714, and a copper layer 715 accumulated or combined in the order of which the above are described.

The metallic radiation panel 713 may be formed by use of aluminum material, and the lower insulation layer 714 and the upper insulation layer 714 may be formed by anodizing on the surface of the metallic radiation panel 713.

In the structure as the above, after preparing the metallic radiation panel 713, prior to the processes such as the anodizing, the coating, and the etching, the metallic radiation panel 713 may be bent first (S200).

Next, the upper and lower insulation layers 714 may be formed by anodizing the surface of the bent metallic radiation panel 713 (S210).

Then, the copper layer 715 may be coated at the upper insulation layer 714 (S220).

After the above, the circuit pattern may be formed by going through the masking and the etching processes at the copper layer 715 (S230).

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus, comprising:
a liquid crystal panel to display images;
a light source to supply light to the liquid crystal panel;
a light guide plate configured to guide the light emitted from the light source toward the liquid crystal panel; and
a printed circuit board having a light source embedding unit where the light source is embedded, and a connector mounting unit where a connector configured to connect to an outside circuit, is mounted; and
a bottom chassis configured to support the printed circuit board, the bottom chassis including an outer surface and an accommodation hole to accommodate a portion of the connector mounting unit and the connector,
wherein the printed circuit board is bent to position the connector mounting unit offset from the light source embedding unit into the accommodation hole, and
wherein the portion of the connector mounting unit and the connector are disposed such that they are inside a plane defining the outer surface of the bottom chassis.

2. The display apparatus of claim 1, wherein:
the printed circuit board is bent such that the connector does not protrude past an upper surface of the light source embedding unit.

3. The display apparatus of claim 1, wherein:
the light source embedding unit is disposed parallel to the liquid crystal panel.

4. The display apparatus of claim 1, wherein:
the light source embedding unit supports a reflector sheet configured to reflect light radiated from the light source.

5. The display apparatus of claim 1, wherein:
the printed circuit board comprises a metallic radiation panel, an insulation layer at an upper portion of the metallic radiation panel, and a copper layer at an upper portion of the insulation layer.

6. The display apparatus of claim 1, wherein:
the connector mounting unit is bent in an angular manner at the light source embedding unit.

7. The display apparatus of claim 1, wherein:
the connector mounting unit is bent in a round manner at the light source embedding unit.

8. The display apparatus of claim 1, further comprising:
a step unit to connect the light source embedding unit and the connector mounting unit.

9. The display apparatus of claim 8, wherein:
the light source embedding unit and the connector mounting unit are parallel to each other.

10. The display apparatus of claim 1, wherein:
the light source is disposed at least at a one side of a plurality of long sides and a plurality of short sides of the liquid crystal panel.

11. The display apparatus of claim 1, wherein:
the light source is disposed directly adjacent the liquid crystal panel.

12. A display apparatus, comprising:
a printed circuit board with a light source plane coupled to a connector mounting plane at a border with the printed circuit board being bent in association with the border;
a light source disposed on the light source plane;
a reflector disposed on the light source plane adjacent to the light source;

a light guide disposed on the reflector;

a liquid crystal panel disposed adjacent to the light guide to receive light from the light source through the light guide; and a connector connected to the printed circuit board on the connector mounting plane with a connector body adjacent to the reflector; and a bottom chassis configured to support the printed circuit board, the bottom chassis including an outer surface and an accommodation hole to accommodate a portion of the connector mounting plane and the connector, and wherein the portion of the connector mounting plane and the connector are disposed such that they are inside a plane defining the outer surface of the bottom chassis.

13. The apparatus of claim 12, wherein a bend comprises one of angular shaped bending at the border, a round shape at the border and a curved shape bending of connector mounting plane.

14. The apparatus of claim 12, further comprising:

a light source positioned to radiate light directly through a light guide plate.

* * * * *